United States Patent
Lee et al.

(10) Patent No.: US 9,455,367 B2
(45) Date of Patent: Sep. 27, 2016

(54) DISASSEMBLING PHOTOVOLTAIC MODULE

(71) Applicant: KOREA INSTITUTE OF ENERGY RESEARCH, Daejeon (KR)

(72) Inventors: Jin Seok Lee, Daejeon (KR); Young Soo Ahn, Daejeon (KR); Bo Yun Jang, Daejeon (KR); Joon Soo Kim, Daejeon (KR); Gi Hwan Kang, Daejeon (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 0 days.

(21) Appl. No.: 14/503,412

(22) Filed: Oct. 1, 2014

(65) Prior Publication Data

US 2015/0090406 A1    Apr. 2, 2015

(30) Foreign Application Priority Data

Oct. 1, 2013   (KR) .................. 10-2013-0117487
May 16, 2014   (KR) .................. 10-2014-0058817

(51) Int. Cl.
*B32B 38/10* (2006.01)
*H01L 31/18* (2006.01)
*B32B 43/00* (2006.01)
*B32B 38/00* (2006.01)

(52) U.S. Cl.
CPC ............ *H01L 31/18* (2013.01); *B32B 43/006* (2013.01); *B32B 38/0036* (2013.01); *B32B 38/10* (2013.01); *B32B 2309/02* (2013.01); *B32B 2457/12* (2013.01); *Y10T 156/1153* (2015.01); *Y10T 156/1911* (2015.01)

(58) Field of Classification Search
CPC ............ B32B 38/10; B32B 43/006; Y10T 156/1153; Y10T 156/1911
USPC ................................... 156/711, 752
See application file for complete search history.

(56) References Cited

U.S. PATENT DOCUMENTS

| | | | |
|---|---|---|---|
| 6,063,995 A | 5/2000 | Bohland et al. | |
| 6,294,724 B1* | 9/2001 | Sasaoka | H01L 31/048 136/244 |
| 6,940,008 B2* | 9/2005 | Shiotsuka | H01L 31/048 136/244 |
| 7,804,020 B2* | 9/2010 | Yagiura | H01L 31/048 136/243 |
| 2011/0186779 A1* | 8/2011 | Bohland | C22B 7/005 252/301.6 S |

FOREIGN PATENT DOCUMENTS

| | | |
|---|---|---|
| EP | 0893250 A1 | 1/1999 |
| EP | 1187224 A1 | 3/2002 |
| JP | 2003-142714 A | 5/2003 |
| JP | 2005-311178 A | 11/2005 |

* cited by examiner

*Primary Examiner* — Mark A Osele
*Assistant Examiner* — Nickolas Harm
(74) *Attorney, Agent, or Firm* — Patent Office of Dr. Chung Park

(57) ABSTRACT

Provided is a method of disassembling a photovoltaic module. The method includes: applying heat to the photovoltaic module in an oxidizing atmosphere; removing an insulating protective layer wrapping a photovoltaic cell of the photovoltaic module; and obtaining the photovoltaic cell of the photovoltaic module.

15 Claims, 18 Drawing Sheets

ROTATE 90 DEGREES

APPLY HEAT

EMIT GAS

APPLY HEAT

DISASSEMBLING PHOTOVOLTAIC MODULE

CROSS-REFERENCE TO PRIOR APPLICATIONS

This application claims priorities to and the benefit of Korean Patent Application No. 10-2013-0117487 filed on Oct. 1, 2013 and Korean Patent Application No. 10-2014-0058817 filed on May 16, 2014, which are all hereby incorporated by reference in their entirety.

TECHNICAL FIELD

The present invention relates to method for disassembling photovoltaic module.

BACKGROUND

Various alternative energy sources have been developed in order to avoid environmental pollution and global warming caused by carbon dioxide emissions. Among the alternative energy sources, an interest in a photovoltaic module for converting sunlight into electrical energy is increased, and an amount of photovoltaic module installed in many countries is also increased.

When a certain period of time is elapsed after the photovoltaic module is installed, the installed photovoltaic module should be demolished as an efficiency of photoelectric conversion is diminished. As mentioned above, since the amount of the installation of photovoltaic module is increased, the amount of the photovoltaic module to be demolished henceforward is expected to increase as well.

Since the photovoltaic module uses expensive material to enhance the efficiency of photoelectric conversion, if the photovoltaic module is demolished without recovery of such materials, it may cause serious environmental pollution due to discarded photovoltaic module as well as a waste of resources.

Accordingly, a research for the recovery of the material of the photovoltaic module from the discarded photovoltaic module has been progressed.

SUMMARY

In accordance with an aspect of the present invention, a method of disassembling a photovoltaic module comprises applying heat to the photovoltaic module in an oxidizing atmosphere; removing an insulating protective layer wrapping a photovoltaic cell of the photovoltaic module; and obtaining the photovoltaic cell of the photovoltaic module.

The heat ranging from 400° C. to 650° C. may be applied to the photovoltaic module in the oxidizing atmosphere so that the insulating protective layer is removed.

The insulating protective layer may include at least one of ethylene vinyl acetate (EVA), polyvinylfloride (PVF), polyvinyl butyral (PVB), polyethylene, olefin-based resin, silicone-based resin, and ionomer-based resin.

The photovoltaic module may include a glass which is located on one side of the insulating protective layer and a back sheet which is located on the other side of the insulating protective layer, and the insulating protective layer and the back sheet may be removed simultaneously from the photovoltaic module by the heat.

The photovoltaic module may include a glass which is located on one side of the insulating protective layer and a back sheet which is located on the other side of the insulating protective layer, and the insulating protective layer may be removed after a pre-heating for the back sheet is performed to remove the back sheet.

The method of disassembling a photovoltaic module may further comprise removing a frame wrapping a periphery of the photovoltaic module before removing the protective insulating layer.

The photovoltaic module may include a glass which is located on one side of the insulating protective layer, and the glass may be obtained without being damaged.

The method of disassembling a photovoltaic module may further comprise obtaining a conductive ribbon connecting a plurality of the photovoltaic cells.

The conductive ribbon may include a base material and a metal coating layer which covers the base material, and a volume of the metal coating layer may be increased, so that the conductive ribbon is separated from the photovoltaic cells in a process of removing the insulating protective layer in the oxidation atmosphere.

The metal coating layer may be separated from the base material by applying a force to the oxidized metal coating layer.

Moisture may be inpoured in a process of removing the insulating protective layer in the oxidizing atmosphere.

In accordance with other aspect of the present invention, a method of disassembling a photovoltaic module that recovers a photovoltaic cell from the photovoltaic module in which a glass, a first encapsulant, the photovoltaic cell, and a second encapsulant are sequentially disposed, the method comprises forming a crack on the glass; applying heat to the glass and the second encapsulant; and recovering the photovoltaic cell.

The method of disassembling a photovoltaic module may further comprises forming a pattern on the second encapsulant before applying heat to the glass and the second encapsulant.

The method of disassembling a photovoltaic module may further comprises laying the second encapsulant on a first pattern member that provides the pattern, and heating the first pattern member; and moving the second encapsulant on which the pattern is formed to a second pattern member having a temperature lower than that of the first pattern member.

In accordance with another aspect of the present invention, a method of disassembling a photovoltaic module that recovers a photovoltaic cell from the photovoltaic module in which a glass, a first encapsulant, the photovoltaic cell, and a second encapsulant are sequentially disposed, the method comprises forming a pattern on the second encapsulant; applying heat to the glass and the second encapsulant; and recovering the photovoltaic cell.

The method of claim 15, further comprising forming a crack on the grass.

The method of disassembling a photovoltaic module may further comprises performing a pre-heating to one of the glass on which the crack is formed and the second encapsulant on which the pattern is formed.

The method of disassembling a photovoltaic module may further comprises laying the second encapsulant on a first pattern member that provides the pattern, and heating the first pattern member; and moving the second encapsulant on which the pattern is formed to a second pattern member having a temperature lower than that of the first pattern member.

A temperature of the pre-heating may be higher than that of the heat, and a time to perform the pre-heating may be shorter than a time to apply the heat.

BRIEF DESCRIPTION OF THE DRAWINGS

The objects, features and advantages of the present invention will be more apparent from the following detailed description in conjunction with the accompanying drawings, in which.

DETAILED DESCRIPTION

Exemplary embodiments of the present invention are described with reference to the accompanying drawings in detail. The same reference numbers are used throughout the drawings to refer to the same or like parts. Detailed descriptions of well-known functions and structures incorporated herein may be omitted to avoid obscuring the subject matter of the present invention.

Figure 1:
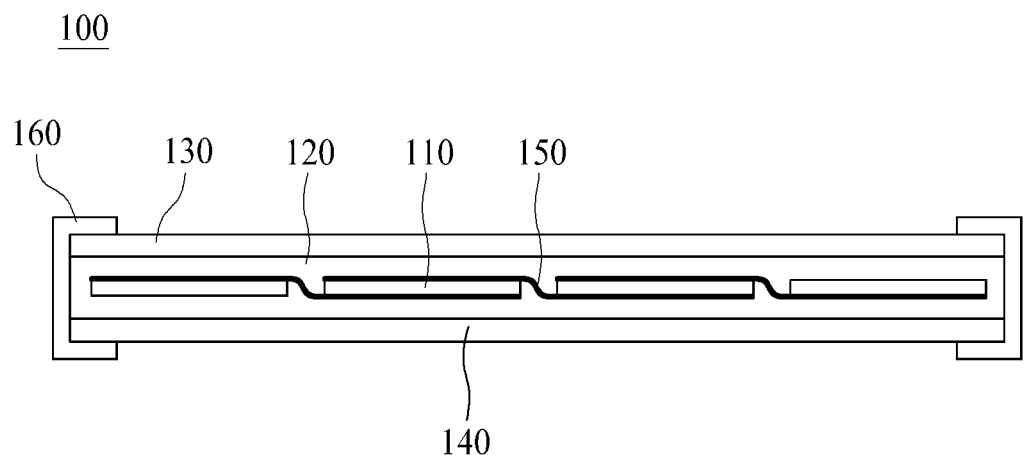
FIGS. 1, 2, and 6 illustrate a configuration of a photovoltaic module.
Figure 2:
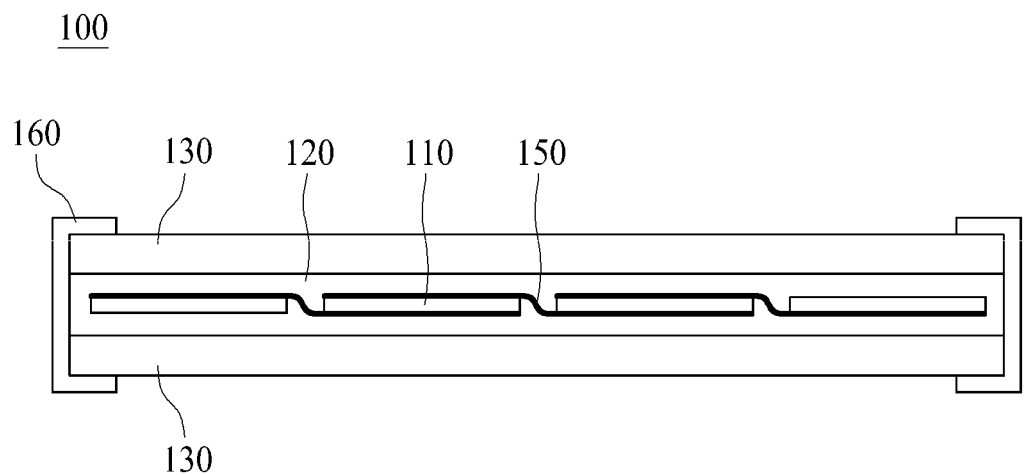

FIGS. 1 and 2 illustrate a configuration of a photovoltaic module 100. As shown in FIG. 1, the photovoltaic module 100 may include an insulating protective layer 120 wrapping a photovoltaic cell 110, a glass 130 which is located on one side of the insulating protective layer 120, a back sheet 140 which is located on the other side of the insulating protective layer 120, a conductive ribbon 150 which connects the photovoltaic cellS 110 in series, and a frame 160 which wraps a periphery of the photovoltaic module 100.

In addition, as shown in FIG. 2, the photovoltaic module 100 may include an insulating protective layer 120 wrapping a photovoltaic cell 110, a glass 130 which is located on both sides of the insulating protective layer 120, a conductive ribbon 150 which connects the photovoltaic cellS 110 in series, and a frame 160 which wraps a periphery of the photovoltaic module 100.

Figure 3:
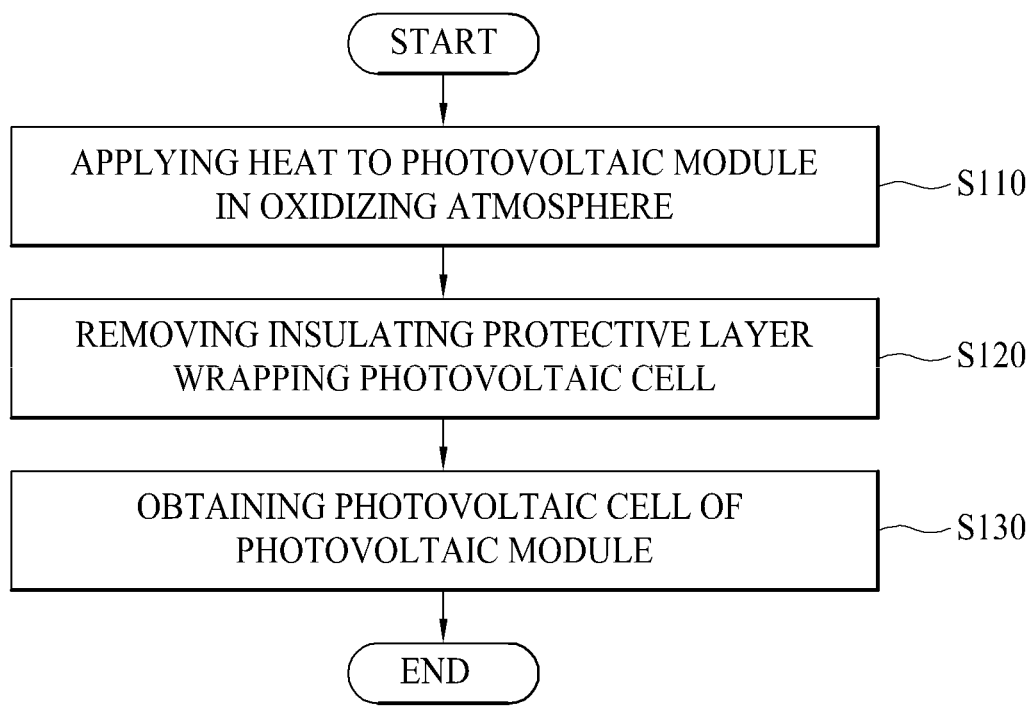
FIG. 3 is a flowchart illustrating a method of disassembling a photovoltaic module according to a first embodiment of the present invention.

FIG. 3 is a flowchart illustrating a method of disassembling the photovoltaic module 100 according to a first embodiment of the present invention. As shown in FIG. 3, the method of disassembling the photovoltaic module 100 according to a first embodiment of the present invention may include a step of applying heat to the photovoltaic module 100 in an oxidizing atmosphere (S110), a step of removing the insulating protective layer wrapping the photovoltaic cell 110 (S120), and a step of obtaining the photovoltaic cell 110 of the photovoltaic module 100 (S130).

The glass 130 of the photovoltaic module 100 may be obtained through the method of disassembling the photovoltaic module 100 according to a first embodiment of the present invention, which will be described later in detail.

The insulating protective layer 120 may include at least one of ethylene vinyl acetate (EVA), polyvinylfloride (PVF), polyvinyl butyral (PVB), polyethylene, olefin-based resin, silicone-based resin, and ionomer-based resin.

Since the photovoltaic module is used outdoors over about 20 years, it is badly affected by natural environment. In order to protect the photovoltaic module from such an environment, the insulating protective layer(120) may have high weatherproof, durability, and optical properties.

EVA is a copolymer of ethylene and vinyl acetate, and has superior optical properties and a high adhesion performance, and is able to improve physical properties such as heat-proof/durability, machinability, and insulating property when being mixed with appropriate additives.

The removal of the insulating protective layer 120 may be achieved by heating the photovoltaic module 100 in a range of 400° C. to 650° C. in an oxidizing atmosphere. As mentioned above, since the insulating protective layer 120 may be made of a resin-based material, the insulating protective layer 120 may be burnt to be removed when 400° C. or more heat is applied.

In this case, heat may be 650° C. or less, which may be set in consideration of a melting point of a metal that forms an electrode of photovoltaic cell 110. For example, if the electrode is made of aluminum, the melting point of aluminum is 660° C. Thus, the temperature of heat may be set to 650° C. or less by setting a margin while setting the temperature to be lower than the melting point of aluminum.

As described above in FIG. 1, the photovoltaic module 100 may include the glass 130 which is located on one side of the insulating protective layer 120 and the back sheet 140 which is located on the other side of the insulating protective layer 120. Since both the insulating protective layer 120 and the back sheet 140 may be simultaneously burnt by heat applied to the photovoltaic module 100, the insulating protective layer 120 and the back sheet 140 may be removed. Accordingly, a separate process for removing the back sheet 140 from the photovoltaic module 100 may not be necessary.

The back sheet 140 may be implemented in the form of a film in which a plurality of functional layers are laminated, and may have a structure that wraps a base film having an excellent barrier properties for water vapor and oxygen with a fluoropolymer film having an excellent weatherproof.

The base film may be made of polyethylene terephthalate (PET), and the weatherproof fluoropolymer film may be made of a polyvinyl fluoride (PVF). The PET is a polymer material that has superior water vapor barrier properties and is relatively inexpensive, and the PVF have an excellent weatherproof which is not much affected by environmental influences such as UV rays, IR rays, and ozone.

In this case, the surface of the PET or PVF may be processed by a corona discharge or a similar technique so as to improve an adhesion between the base film and the weatherproof fluoropolymer film, such that the adhesion may be improved. Alternatively, an adhesive may be applied on the PET so as to increase the adhesion.

As mentioned above, the back sheet 140 may be a PVF based back sheet, and the PVF based back sheet may be a PVF back sheet or a PVDF back sheet, but not limited thereto.

A ceramic powder may be generated in a process of burning the PET of the back sheet 140 together with the insulating protective layer 120 by heat. If the ceramic powder is attached to the photovoltaic cell 110 when the photovoltaic module 100 is disassembled, a separate process for separating the ceramic powder from the photovoltaic cell 110 may be necessary.

Thus, the back sheet 140 may be first removed from the photovoltaic module 100, and then, the insulating protective layer 120 may be removed by heat, without simultaneously removing both the back sheet 140 and the insulating protective layer 120 by using heat.

That is, the insulating protective layer 120 may be removed by applying heat, after removal of the back sheet 140 by performing pre-heating for the back sheet 140. The temperature of pre-heating for the back sheet 140 may be lower than the temperature of heat applied to remove the insulating protective layer 120.

Since the adhesion of adhesive applied to the back sheet 140 is lowered when the pre-heating is achieved, an operator or an operating system may dismantle the back sheet 140 from the photovoltaic module 100 by applying a force to the back sheet 140.

Figure 4:
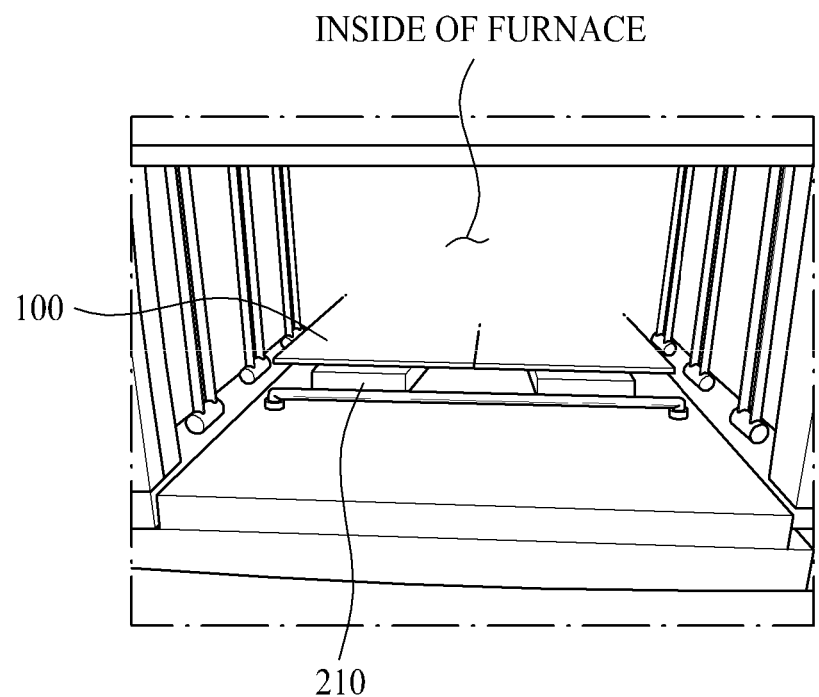
FIG. 4 illustrates an example of a furnace for applying heat to a photovoltaic module.

In the meantime, as described above, heat may be applied to the photovoltaic module 100 in an oxidizing atmosphere. FIG. 4 illustrates an example of a furnace for applying heat to the photovoltaic module 100. As shown in FIG. 4, the photovoltaic module 100 may be disposed within the furnace in a state in which the photovoltaic module 100 is laid on a module support 210.

The insulating protective layer 120 of the photovoltaic module 100 may be removed, when a heating unit (not shown) installed in the furnace applies heat to the photovoltaic module 100. At this time, as an internal of the furnace is exposed to the atmosphere, the insulating protective layer 120 may be removed in the oxidizing atmosphere.

In addition to such a batch type furnace, heat may be applied to the photovoltaic module 100 by moving the photovoltaic module 100 to a hot zone of the furnace through a conveyor belt.

Further, since a gas which is generated when the photovoltaic module 100 is oxidized in the furnace is moved to a scrubber(not shown) connected to the furnace and is removed, the gas may not leak to the atmosphere.

Like this, since the insulating protective layer 120 may be removed in the oxidizing atmosphere, $SiO_2$ may be generated on the photovoltaic cell 110 including silicon during a process in which the insulating protection layer 120 is removed.

For example, the photovoltaic cell 110 including silicon may be broken during the process of removing the insulating protection layer 120 in the oxidizing atmosphere. Since a SiNx layer and an electrode (not shown) are formed on one surface and the other surface of the photovoltaic cell 110 respectively, both surfaces of the photovoltaic cell 110 may not be exposed to the oxidizing atmosphere. However, a cross section of the broken photovoltaic cell 110 may be exposed to the oxidizing atmosphere, and, accordingly, the cross-sectional surface may be oxidized into $SiO_2$.

The photovoltaic cell 110 having a surface in which $SiO_2$ is formed as described above may include an electrode in which current flows. After obtaining the photovoltaic cell 110 from the photovoltaic module 100, the electrode may be separated from the photovoltaic cell 110 by a contact of the electrode and an alkaline aqueous solution.

For example, if the electrode is made of aluminum, and the alkaline aqueous solution is 20 wt % NaOH aqueous solution, a reaction between Al and the NaOH aqueous solution is as follows.

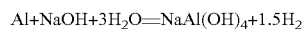

$NaAl(OH)_4$ which is formed through such reaction may be reduced to Al and NaOH through a circulation cycle of an aluminum smelting process. The circulation cycle of the aluminum smelting process is as follows.

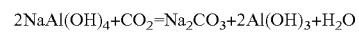

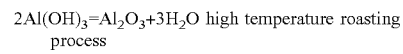

If $Al2O_3$ and $Na_3AlF_6$ are mixed, it exists as a liquid at about 1000° C., such that Al is recovered from $Al_2O_3$ in a cathode by using an electrolytic smelting process, and O2 generated in an anode may be released as $CO_2$ by reacting with C which is an anode material.

As mentioned above, the alkaline aqueous solution may be used in order to recover the constituent materials of the electrode of the photovoltaic cell 110, and, in this process, $SiO_2$ may protect the photovoltaic cell 110 from the alkaline aqueous solution.

Therefore, it is possible to prevent the silicon of the photovoltaic cell 110 from being contaminated by the alkaline aqueous solution, and prevent a decrease of recovery rate of the silicon due to an etching of the silicon by the alkaline aqueous solution.

Since $SiO_2$ should be removed in order that high-purity silicon is recovered from the photovoltaic cell 110, $SiO_2$ may be removed through an etching process of the photovoltaic cell 110 after separating the electrode. The etching process of the $SiO_2$ may be achieved by hydrofluoric acid (HF) solution, but not limited thereto.

In the meantime, as shown in FIGS. 1 and 2, the photovoltaic module 100 may include a frame 160 that wraps the periphery of photovoltaic module 100. In case of the photovoltaic module 100 having such structure, the method of disassembling a photovoltaic module according to the first embodiment of the present invention may further include removing the frame 160 that wraps the periphery of photovoltaic module 100 before removing the insulating protective layer 120.

As shown in FIG. 1, the glass 130 and the back sheet 140 may be located on both sides of the insulating protective layer 120 or, as shown in FIG. 2, the glass 130 may be located on both sides of the insulating protective layer 120. Therefore, when the insulating protective layer 120 is removed by heat, the glass 130 may be naturally obtained from the photovoltaic module 100 without being damaged.

In addition, when the insulating protective layer 120 of the photovoltaic module 100 of FIG. 2 is also removed by heat, the glass 130 located on both sides of the insulating protective layer 120 may be naturally obtained from the photovoltaic module 100 without being damaged.

Accordingly, a glass substrate convenient for reuse can be obtained in the process of disassembling of the photovoltaic module 100.

That is, the glass 130 used in the photovoltaic module 100 may be processed with a reinforcing treatment, and the glass 130 may be obtained without being damaged since a surface tension of glass 130 due to reinforcing treatment may be eliminated by a heat treatment.

As described above, since the glass may be obtained without being damaged as the surface tension of glass 130 is eliminated by the heat treatment, the glass may be cut. Accordingly, the glass 130 obtained from the large photovoltaic module 100 may be cut to be reused for a glass of small photovoltaic module.

Figure 5:
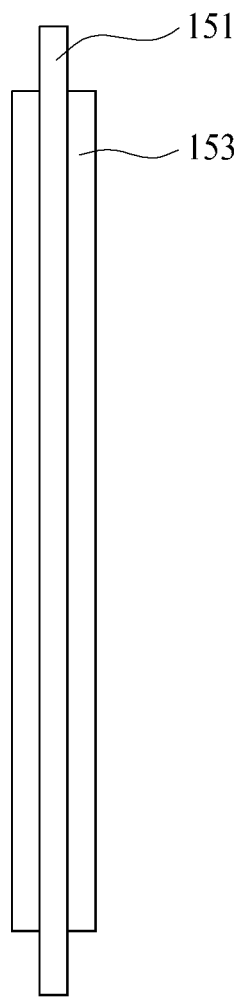
FIG. 5 illustrates a cross section of a conductive ribbon.

In addition, as shown in FIGS. 1, 2, and 5, the conductive ribbon 150 may connect between the photovoltaic cells 110, and may include a base material 151 and a metal coating layer 153 which covers the base material 151. In this case, the base material 151 may include a copper, but it is just an example and not limited thereto. Thus, the base material 151 may be implemented by various materials in which current can flow.

In this case, the method of disassembling a photovoltaic module according to the first embodiment of the present invention may further include obtaining the conductive ribbon 150 that connects a plurality of photovoltaic cell 110.

In the process of removing the insulating protective layer 120 in the oxidizing atmosphere, the metal coating layer 153 may be oxidized and separated from the photovoltaic cell 110. If the metal coating layer 153 is oxidized, metallic oxide may be generated while the volume of the metal coating layer 153 is expanded.

When the volume of the metal coating layer 153 is expanded as described above, the conductive ribbon 150 may be separated from the photovoltaic cell 110. Therefore, the method of disassembling a photovoltaic module according to the first embodiment of the present invention may separate the conductive ribbon 150 from the photovoltaic cell 110 without a separate process.

In this case, the metal coating layer 153 may be separated from the base material 151 when a force is applied to the oxidized metal coating layer 153. Because of the volume expansion of the metal coating layer 153 due to oxidation, the adhesive force between the metal coating layer 153 and the base material 151 is much reduced.

Accordingly, when a force is applied to the metal coating layer 153 through a tool that can strike or give a frictional force, the metal coating layer 153 is detached from the base material 151, so that the base material 151 may be recovered.

As described above, the high purity base material 151 may be recovered through a relatively simple removal process of applying a force, not through a high temperature removal process or a chemical removal process in order to remove the metal coating layer 153.

In addition, moisture may be inpoured in the process of removing the insulating protective layer 120 in the oxidizing atmosphere. When the moisture is inpoured in the oxidizing atmosphere, oxidation degree is increased, and therefore, the oxidation of the metal coating layer 153 of the conductive ribbon 150 may be more smoothly achieved. Since the oxidized metal coating layer 153 is expanded more largely as the metal coating layer 153 is more smoothly oxidized, the conductive ribbon 150 may be separated well from the photovoltaic cell 110.

The inpour of moisture may be achieved by various methods. For example, moisture may be injected into the inside of the furnace of FIG. 3 through a nozzle.

The photovoltaic cell 110 may be damaged in the process of removing the insulating protective layer 120 by applying heat as described above. However, the methods of disassembling a photovoltaic module 100 according to a second embodiment and a third embodiment of the present invention which are described later may prevent the damage of the photovoltaic cell 110.

Figure 6:
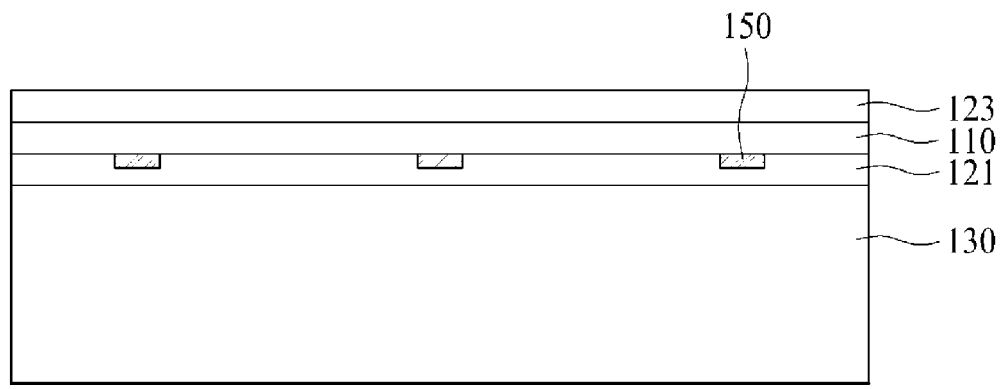

FIG. 6 illustrates an example of a photovoltaic module. As shown in FIG. 6, in the photovoltaic module, the glass 130, a first encapsulant 121, the photovoltaic cell 110, and a second encapsulant 123 may be arranged sequentially, and the photovoltaic cell 110 may be recovered from the photovoltaic module through the methods of disassembling a photovoltaic module according to the second embodiment and the third embodiment of the present invention.

At this time, the first encapsulant 121 and the second encapsulant 123 may correspond to the insulating protective layer 120 which is located on both sides of the photovoltaic cell 110.

The photovoltaic cell 110 may include the conductive ribbon 150 in which current flows. Since the conductive ribbon 150 shown in FIGS. 9A, 9B, 12, 15 and 16 was described through the first embodiment of the present invention, a detailed description is omitted.

The first encapsulant 121 and the second encapsulant 123 may protect the photovoltaic cell 110 from foreign material such as fine dust and moisture or external shock.

In addition, the photovoltaic module may usually further include the back sheet 140 having an excellent weatherproof and electrical insulation, and the back sheet 140 may protect the photovoltaic cell 110.

The methods of disassembling a photovoltaic module according to the second embodiment and the third embodiment of the present invention may recover the photovoltaic cell 110 in a state in which the second encapsulant 123 is exposed as the back sheet 140 of the photovoltaic module is removed.

In addition, the first encapsulant 121 and the second encapsulant 123 shown in FIG. 6 can include at least one of ethylene vinyl acetate (EVA), polyvinylfloride (PVF), polyvinyl butyral (PVB), polyethylene, olefin-based resin, silicone-based resin, or ionomer-based resin.

Figure 7:
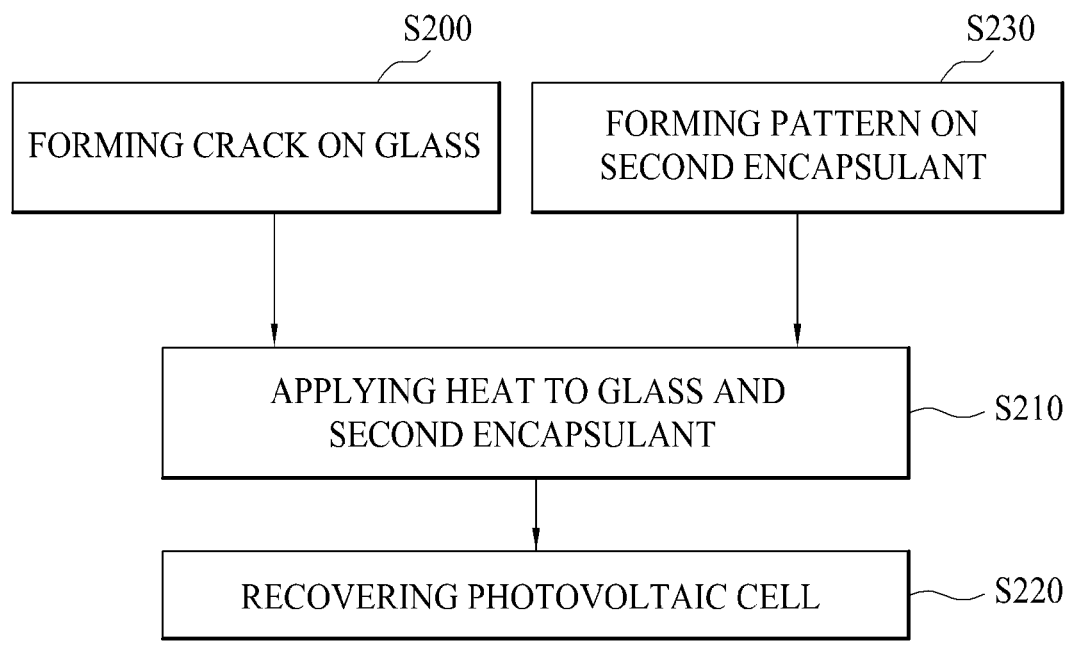
FIG. 7 is a flowchart illustrating a method of disassembling a photovoltaic module according to a second embodiment of the present invention.

As described above, in order to recover the photovoltaic cell 110 from the photovoltaic module including the glass 130, the first encapsulant 121, the photovoltaic cell 110, and the second encapsulant 123, the method of disassembling a photovoltaic module according to the second embodiment shown in FIG. 7 may be used.

As shown in FIG. 6 and FIG. 7, the method of disassembling a photovoltaic module according to the second embodiment may include a step of forming a crack on the glass 130 (S200), a step of applying heat to the glass 130 and the second encapsulant 123 (S210), and a step of recovering the photovoltaic cell 110 (S220).

The method of disassembling a photovoltaic module according to the second embodiment may further include a step of forming a pattern on the second encapsulant 123 before applying heat to the glass 130 and the second encapsulant 123 (S230).

The formation of the crack and the pattern is described later in detail with reference to drawing.

The glass 130 used for the photovoltaic module may be a glass 130 having a high temperature characteristics and a high strength. For example, a reinforced glass may be included in the photovoltaic module, and may be broken into much smaller pieces not to be angulated when a shock is applied due to the nature of the reinforced glass.

Figure 8:
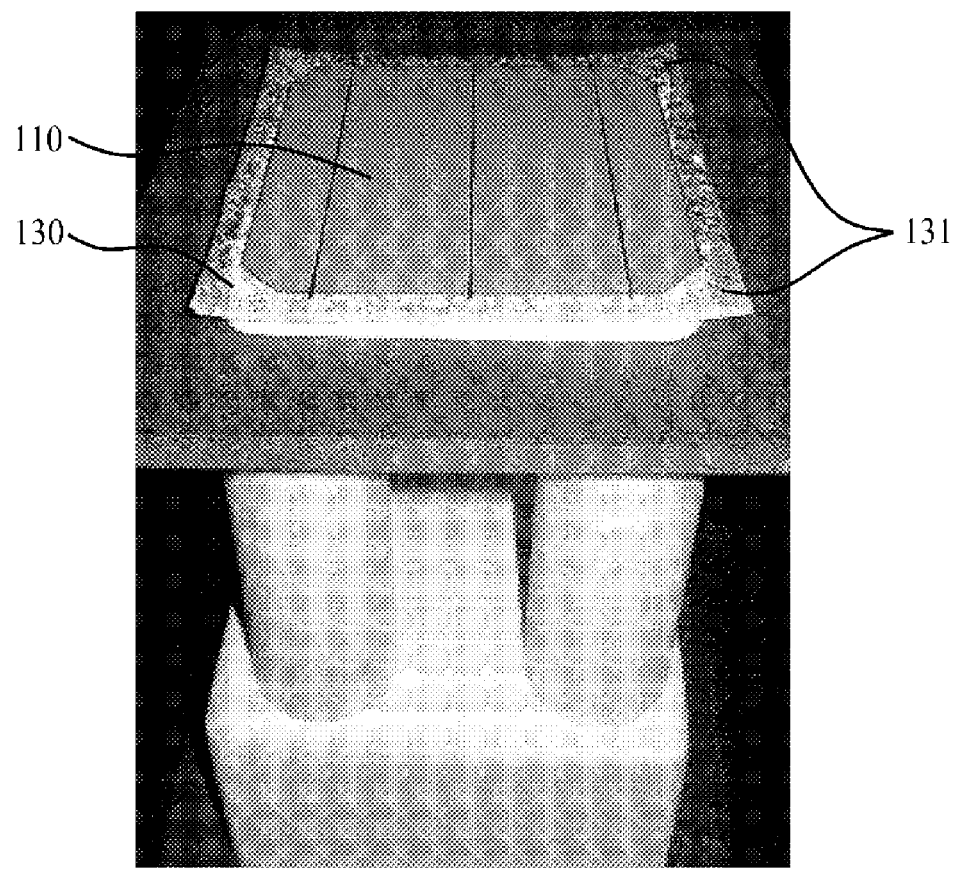
FIG. 8 illustrates a plan view of a photovoltaic module in which a crack is formed on glass of the photovoltaic module.

Thus, in the step of forming a crack on the glass 130 (S200) in the method of disassembling a photovoltaic module according to the present invention, a crack may be formed in the glass 130 without damage of the photovoltaic cell 110 by applying a force to a corner 131 of the glass 130 shown in FIG. 8.

For example, in the case of the reinforced glass, when a force is applied to the corner of the reinforced glass, the crack may be formed on the entire area of the reinforced glass as well as the corner area.

Various tools or devices (not shown) may be used to apply force to the corner 131 of the glass 130. For example, a tapered cylindrical member may be used.

When an operator or a device applies force to the member, the force may be delivered to each corner 131 of the glass 130 through the member, so that crack 132 may be formed on the glass 130. At this time, the force that the operator or the device applies to the member may be adjusted to the extent that the photovoltaic cell 110 is not damaged.

As a result, as shown in FIG. 8, even if crack is formed on the glass 130, the photovoltaic cell 110 may not be damaged. Since the first encapsulant 121 and the second encapsulant 123 are transparent, the first encapsulant 121 and the second encapsulant 123 are not shown clearly in FIG. 8.

Figure 9A:
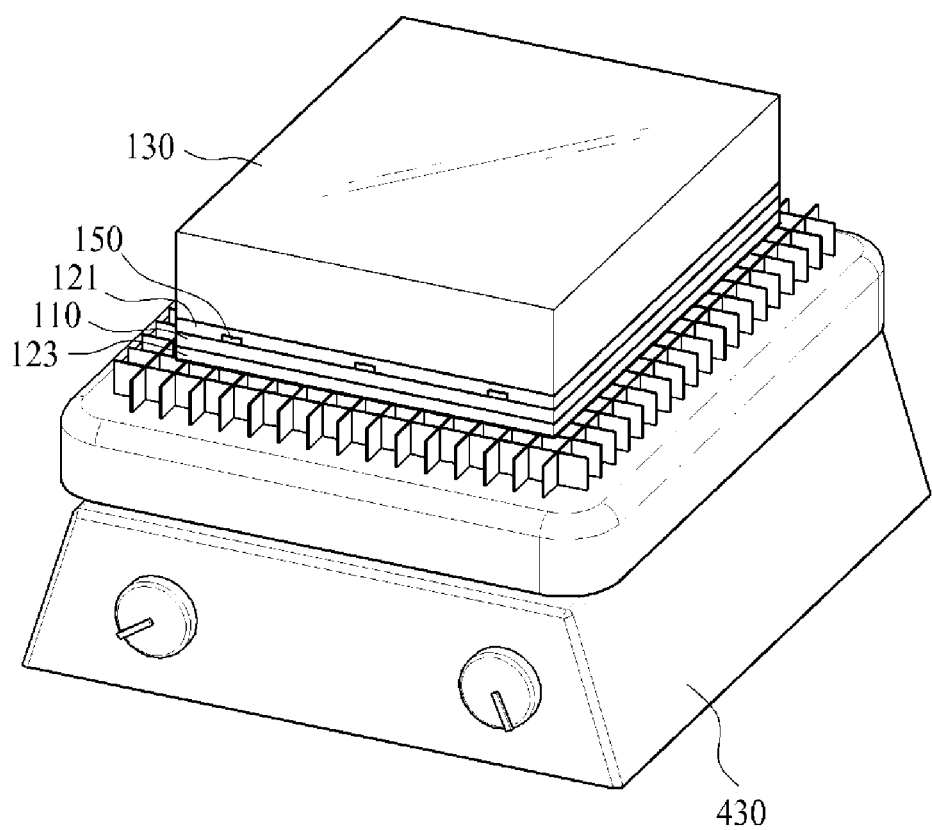
FIGS. 9A and 9B illustrate a method of forming a pattern on a second encapsulant.

In the meantime, a heating device 430 shown in FIG. 9A may be used to perform the step (S230) of forming a pattern on the second encapsulant 123.

As shown in FIG. 9A, the second encapsulant 123 may be laid on a pattern member 420 that provides a pattern, and the pattern member 420 may be heated.

The pattern member 420 may have a lattice frame shape. The pattern member 420 may have various shapes in addition to the lattice frame shape. For example, the pattern member 420 may be a knife, and an operator or an operation unit may operate the knife to form a pattern on the second encapsulant 123.

When the pattern member 420 is heated by the heating device 430, heat of the pattern member 420 is transmitted to the second encapsulant 123 so that the second encapsulant 123 may be heated. A pattern may be formed on the second encapsulant 123 as the heated second encapsulant 123 is melted.

When the pattern is formed on the second encapsulant 123, an electric power of the heating device 430 may be blocked. Accordingly, the transmission of the heat from the heating device 430 to the pattern member 420 is stopped.

At this time, after the second encapsulant 123 and the pattern member 420 are cooled, the second encapsulant 123 and the pattern member 420 may be separated from each other.

When the second encapsulant 123 and the pattern member 420 are separated in the state in which the temperature of the second encapsulant 123 and the pattern member 420 is increased, the second encapsulant 123 recovers elasticity in the state in which the second encapsulant 123 is heated, such that pattern may be disappeared. In order to prevent this, the second encapsulant 123 and the pattern member 420 may be separated after being cooled in the state in which the second encapsulant 123 and the pattern member 420 are combined.

Figure 9B:
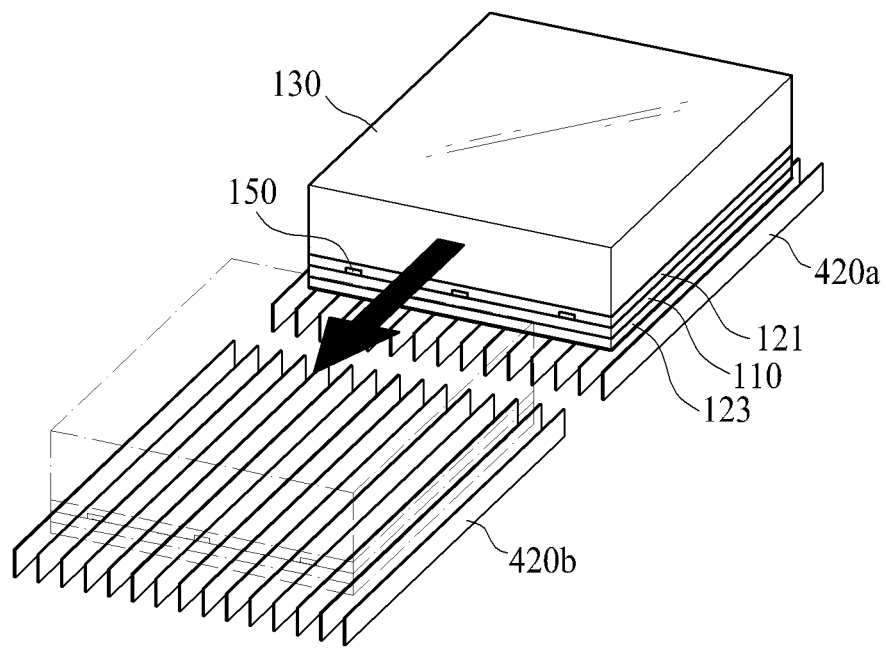
Figure 9B:
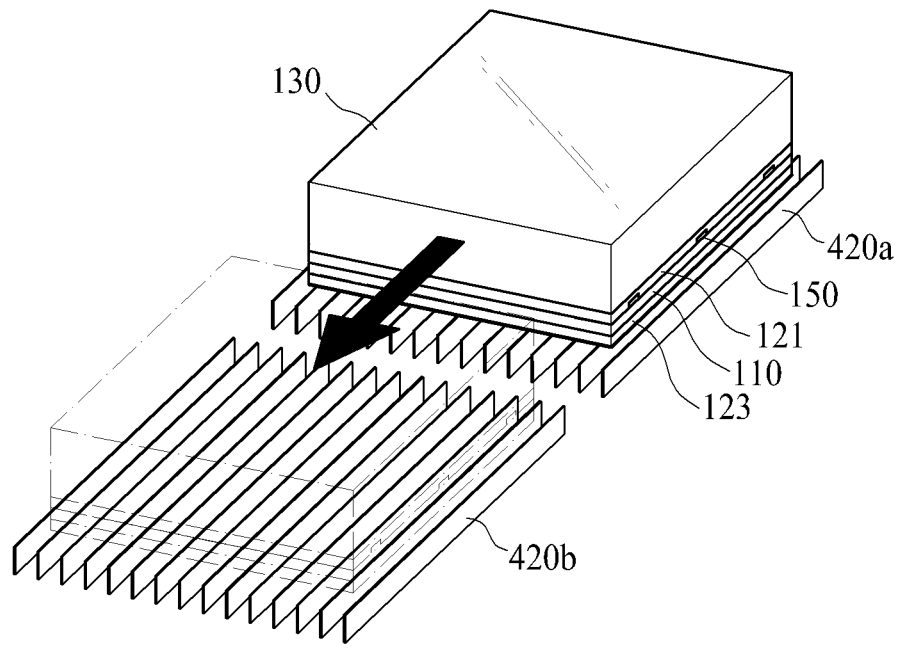

Alternatively, as shown in FIG. 9B, a first pattern member 420A and a second pattern member 420B may be disposed in a row, and the first pattern member 420A may be in a heated state and the temperature of the second pattern member 420B may be lower than the first pattern member 420A.

When the second encapsulant 123 is first laid on the first pattern member 420A, a pattern corresponding to the first pattern member 420A may be formed on the second encapsulant 123 as the first pattern member 420A is in the heated state.

After the pattern is formed, the second encapsulant 123 may move along the first pattern member 420A and may be disposed on the second pattern member 420B. At this time, since the temperature of the second pattern member 420B is low, the pattern portion of the second encapsulant 123 may be cooled, so that the pattern of the second encapsulant 123 may be maintained.

Thereafter, when the second encapsulant 123 is rotated 90 degrees and disposed in the first pattern member 420A and the second pattern member 420B, a lattice pattern may be formed in the second encapsulant 123.

As described above, the method of disassembling a photovoltaic module according to the second embodiment of the present invention may perform the step (S210) of applying heat to the glass 130 and the second encapsulant 123 after forming a crack on the glass 130 and forming a pattern on the second encapsulant 123.

The step of applying heat to the glass 130 and the second encapsulant 123 may be processed in the inside of the furnace, and the glass 130 and the second encapsulant 123 may be exposed to the atmosphere.

A first comparison case and a second comparison case which are different from the second and third embodiments of the present invention may be suggested. The first comparison case and the second comparison case are described with reference to FIG. 10 and FIG. 11.

In the first comparison case, a heat may be applied to the glass 130 and the second encapsulant 123 simultaneously without forming a pattern on the second encapsulant 123 after forming just only a crack on the glass 130 shown in FIG. 6.

When heat is applied to the glass 130 and the second encapsulant 123 simultaneously, the first encapsulant 121 may be burnt by the heat and transformed into a gas. In this case, the gas may be emitted to the outside of the photovoltaic module through the crack of the glass 130.

Accordingly, since the amount of the gas staying between the photovoltaic cell 110 and the glass 130 is little, the photovoltaic cell 110 may not be affected by the pressure of the gas.

In the meantime, the second encapsulant 123 may be rapidly shrunk due to the increase of temperature during the process of being changed into a liquid state. The rapid shrunk of the second encapsulant 123 may serve as a sudden stress on the photovoltaic cell 110, and thus, it may be a cause of damage of the photovoltaic cell 110.

Figure 10:
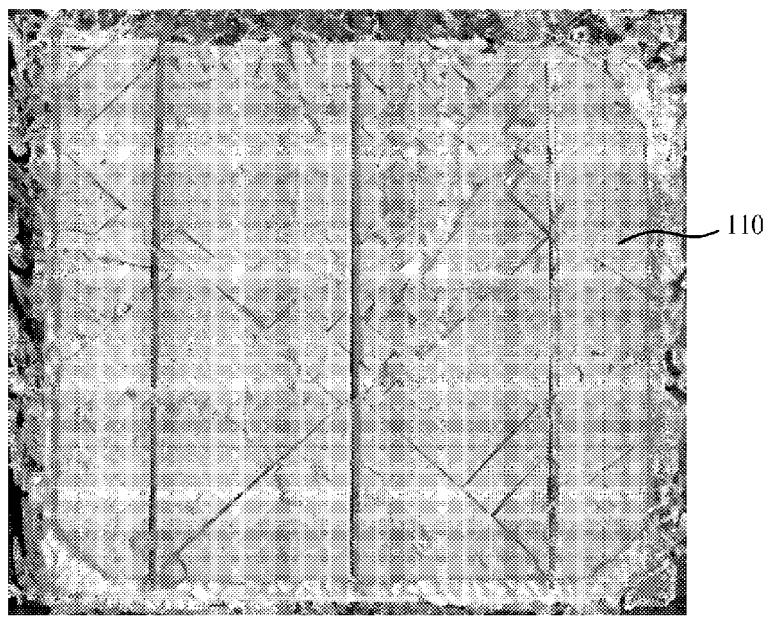
FIG. 10 illustrates a photovoltaic cell recovered through a first comparison case.

Accordingly, in the first comparison case, when heat is applied to the glass 130 and the second encapsulant 123 simultaneously, as shown in FIG. 10, the photovoltaic cell 110 may be damaged.

In the second comparison case, only a pattern is formed on the second encapsulant 123 without forming a crack on the grass 130 shown in FIG. 6, so that heat may be applied to the glass 130 and the second encapsulant 123 simultaneously.

When heat is applied to the glass 130 and the second encapsulant 123 simultaneously, the second encapsulant 123 may be shrunk by heat, and when heat is continuously applied, the second encapsulant 123 may be burnt to be removed. The area of the second encapsulant 123 in contact with the photovoltaic cell 110 may be shrunk due to the pattern.

Thus, when the second encapsulant 123 is shrunk, since the stress applied to the photovoltaic cell 110 is small due to the shrink of second encapsulant 123, the shrink of second encapsulant 123 may not affect the photovoltaic cell 110.

In the meantime, the first encapsulant 121 may be burnt to be changed into a gas. The gas which is generated when the first encapsulant 121 is burnt may be accumulated between the glass 130 and the photovoltaic cell 110 as the gas is not emitted to the outside.

Figure 11:
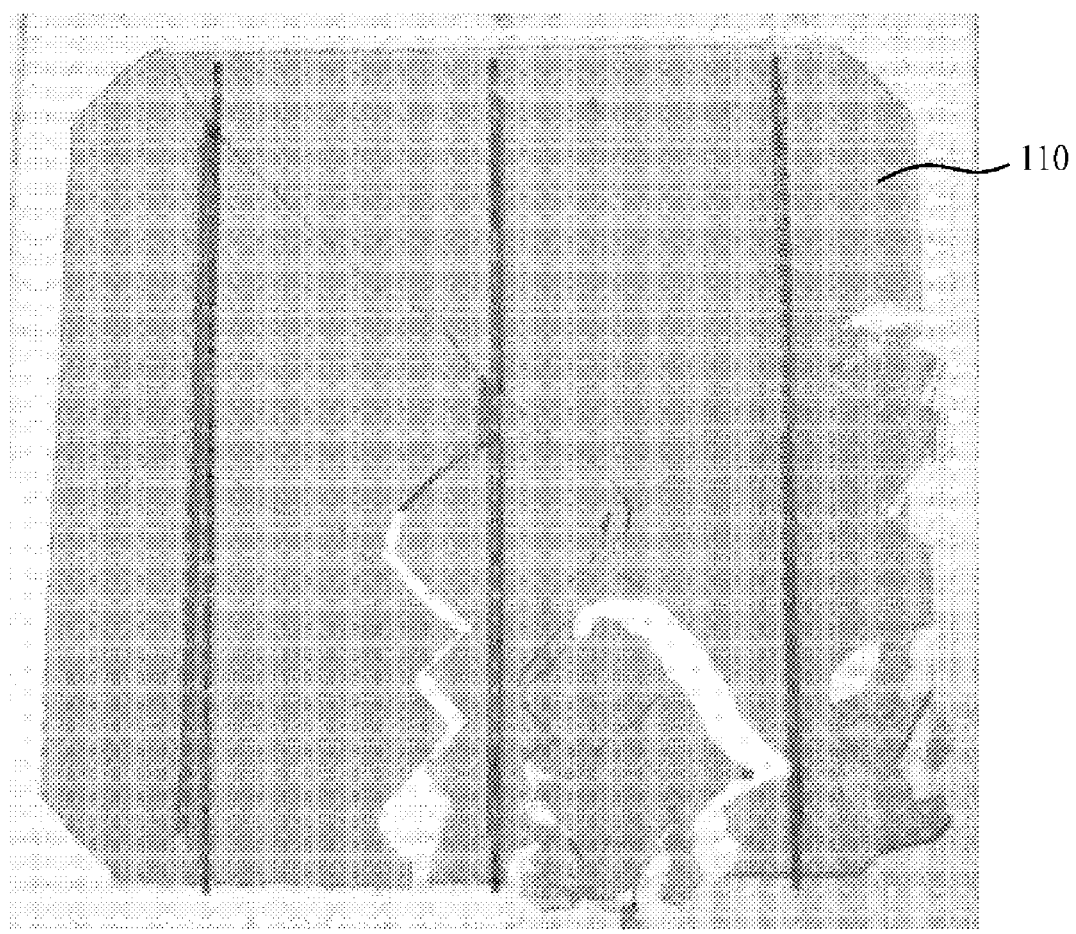
FIG. 11 illustrates a photovoltaic cell recovered through a second comparison case.

Since the gas which is accumulated between the glass 130 and the photovoltaic cell 110 may apply a pressure to the photovoltaic cell 110, if heat is applied to the glass 130 and the second encapsulant 123 simultaneously in the second comparison case, the photovoltaic cell 110 may be broken as shown in FIG. 11.

The method of disassembling a photovoltaic module according to the second embodiment of the present invention may apply heat to the glass 130 and the second encapsulant 123 simultaneously, after forming a crack and a pattern on the glass 130 and the second encapsulant 123 respectively, dissimilarly to the first comparison case and the second comparison case, in order to prevent the photovoltaic cell 110 from being damaged.

Figure 12:
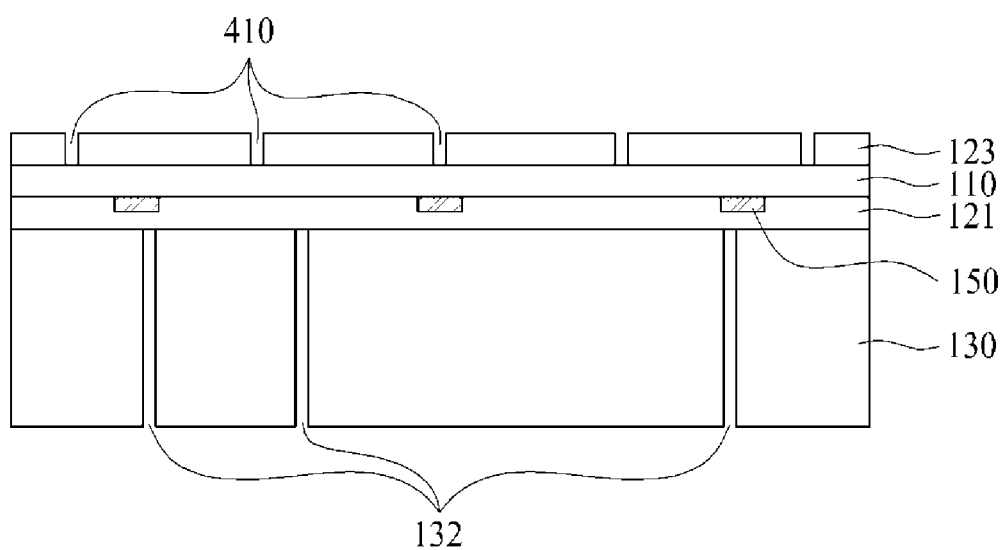
FIG. 12 illustrates a cross-sectional view of a photovoltaic module in which a crack is formed on glass and a pattern is formed on a second encapsulant.

FIG. 12 illustrates a cross-sectional view of a photovoltaic module in which a crack is formed on a glass 130 and a pattern is formed on a second encapsulant 123.

As shown in FIG. 12, at least a portion of the first encapsulant 121 may be exposed to the outside through the crack 132 of the glass 130, and at least a portion of the photovoltaic cell 110 may be exposed to the outside through a pattern 410 of the second encapsulant 123.

Therefore, when heat is applied to the glass 130 and the second encapsulant 123 (S210), the heat may be in direct contact with the first encapsulant 121 and the second encapsulant 123 through the crack 132 and the pattern 410, so that the first encapsulant 121 and the second encapsulant 123 may be burnt.

The gas which is generated when the first encapsulant 121 and the second encapsulant 123 are burnt may be emitted to the outside of the photovoltaic module through the crack 132 and the pattern 410.

As the gas is emitted to the outside of the photovoltaic module, the pressure of the gas applied to the photovoltaic cell 110 may be eliminated.

In addition, when heat is applied simultaneously to the glass 130 and the second encapsulant 123, even if the second encapsulant 123 is shrunk due to heat, the area in which the second encapsulant 123 is in contact with the photovoltaic cell 110 may be reduced due to the pattern, so that the stress applied to the photovoltaic cell 110 due to the shrink of the second encapsulant 123 may be reduced.

Figure 13:
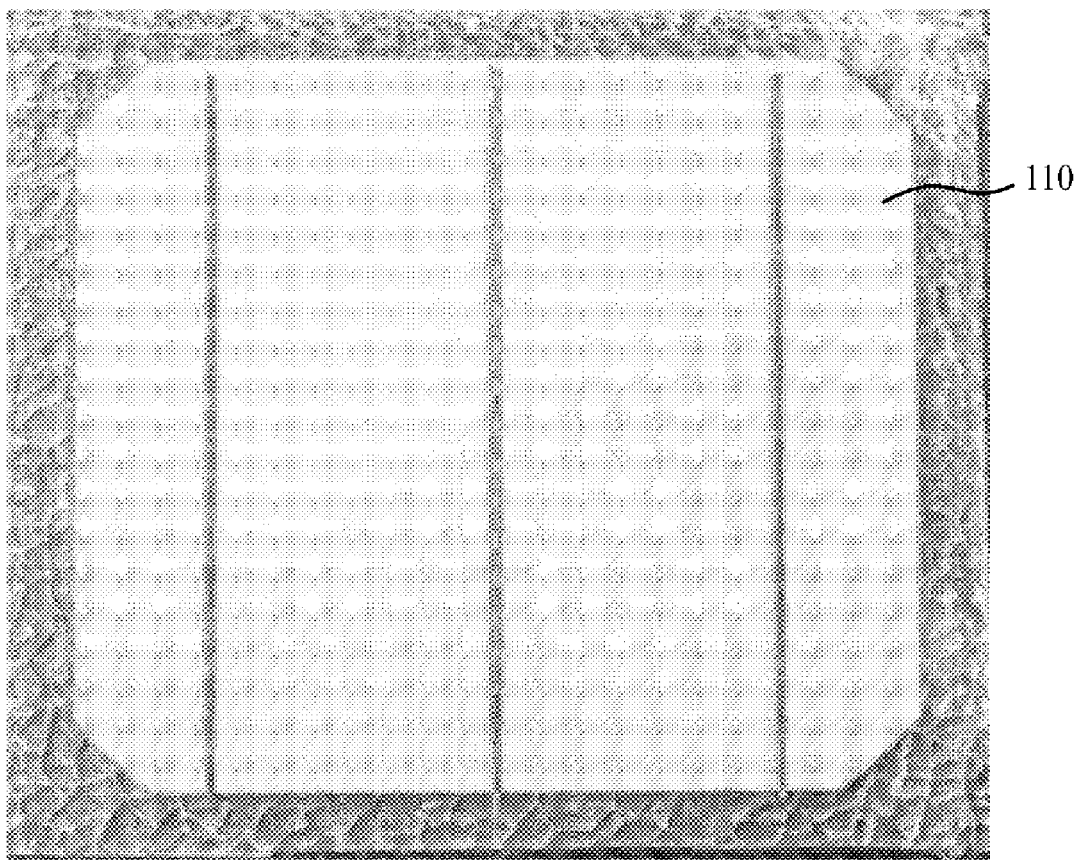
FIG. 13 illustrates a photovoltaic cell recovered through a method of disassembling a photovoltaic module according to a second embodiment of the present invention.

Therefore, when the photovoltaic cell 110 is recovered from the photovoltaic module shown in FIG. 12 through the method of disassembling a photovoltaic module according to the second embodiment of the present invention, as shown in FIG. 13, the damage of the photovoltaic cell 110 may be minimized.

Figure 14:
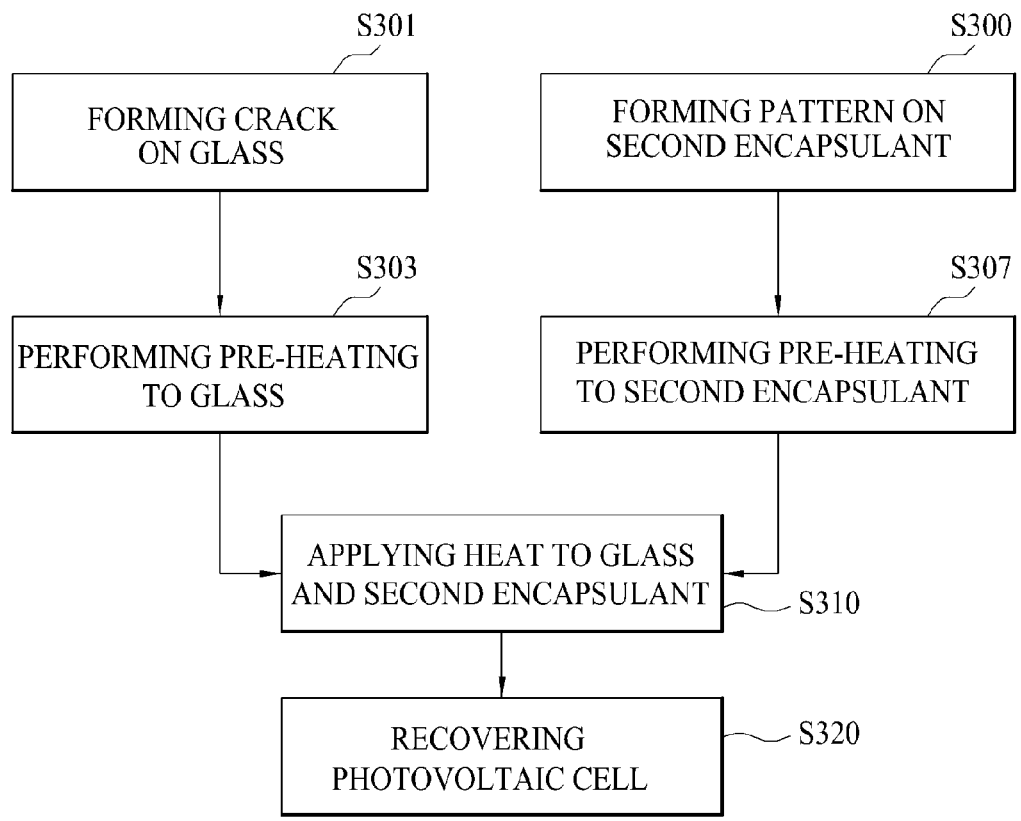
FIG. 14 is a flowchart illustrating a method of disassembling a photovoltaic module according to a third embodiment of the present invention.

FIG. 14 is a flowchart illustrating a method of disassembling a photovoltaic module according to a third embodiment of the present invention.

As shown in FIG. 6 and FIG. 14, the method of disassembling a photovoltaic module according to the third embodiment of the present invention may include a step (S300) of forming a pattern on the second encapsulant 123, a step (S310) of applying heat to the glass 130 and the second encapsulant 123, and a step (S320) of recovering the photovoltaic cell 123.

In this case, the method of disassembling a photovoltaic module according to the third embodiment of the present invention may further include a step (S301) of forming a crack on the glass 130.

In addition, the method of disassembling a photovoltaic module according to the third embodiment of the present invention may further include a step of performing a pre-heating to one of the glass 130 on which the crack is formed and the second encapsulant 123 on which the pattern is formed.

Unlike the method of disassembling a photovoltaic module according to the second embodiment of the present invention, the method of disassembling a photovoltaic module according to the third embodiment of the present invention may form a pattern on the second encapsulant 123.

Since the method of forming a crack on the grass 130 and the method of forming a pattern on the second encapsulant 123 are substantially the same as or similar to a description which was described above with reference to FIGS. 8, 9A, and 9B, a detailed description is omitted.

The method of disassembling a photovoltaic module according to the third embodiment of the present invention may perform a pre-heating to the glass 130 on which the crack is formed without forming a pattern on the second encapsulant 123.

Alternatively, the method of disassembling a photovoltaic module according to the third embodiment of the present invention may perform a pre-heating to the second encapsulant 123 on which the pattern is formed without forming the crack on the glass 130.

Accordingly, the method of disassembling a photovoltaic module according to the third embodiment of the present invention may minimize the damage of the photovoltaic cell 110.

That is, unlike the first comparison case and the second comparison case which were described with reference to the above mentioned FIG. 10 and FIG. 11, the pre-heating may be performed to the glass 130 on which the crack is formed or the second encapsulant 123 on which the pattern is formed before applying the heat to the glass 130 and the second encapsulant 123 simultaneously.

The pre-heating step of the method of disassembling a photovoltaic module according to the third embodiment of the present invention is described with reference to FIG. 15 to FIG. 18.

Figure 15:
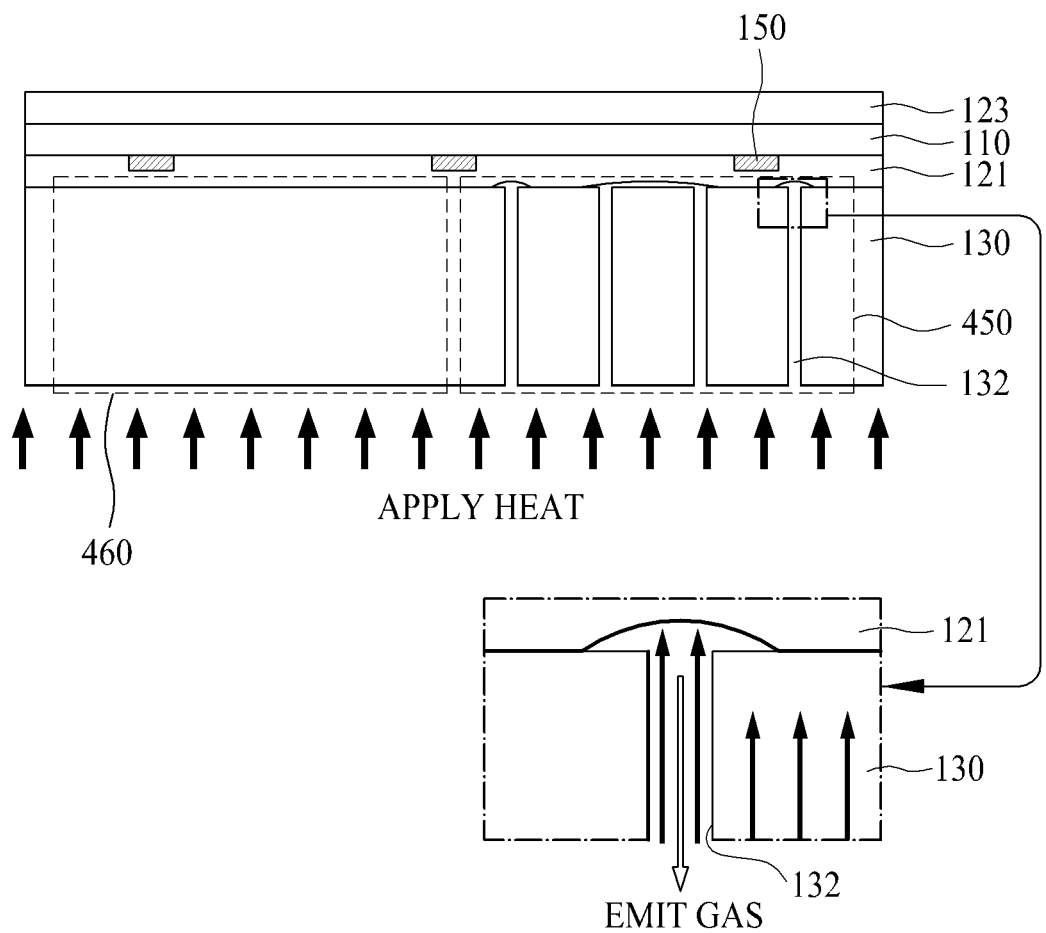
FIG. 15 illustrates a cross-sectional view of a photovoltaic module in which a crack is formed on glass without forming a pattern on a second encapsulant.
Figure 16:
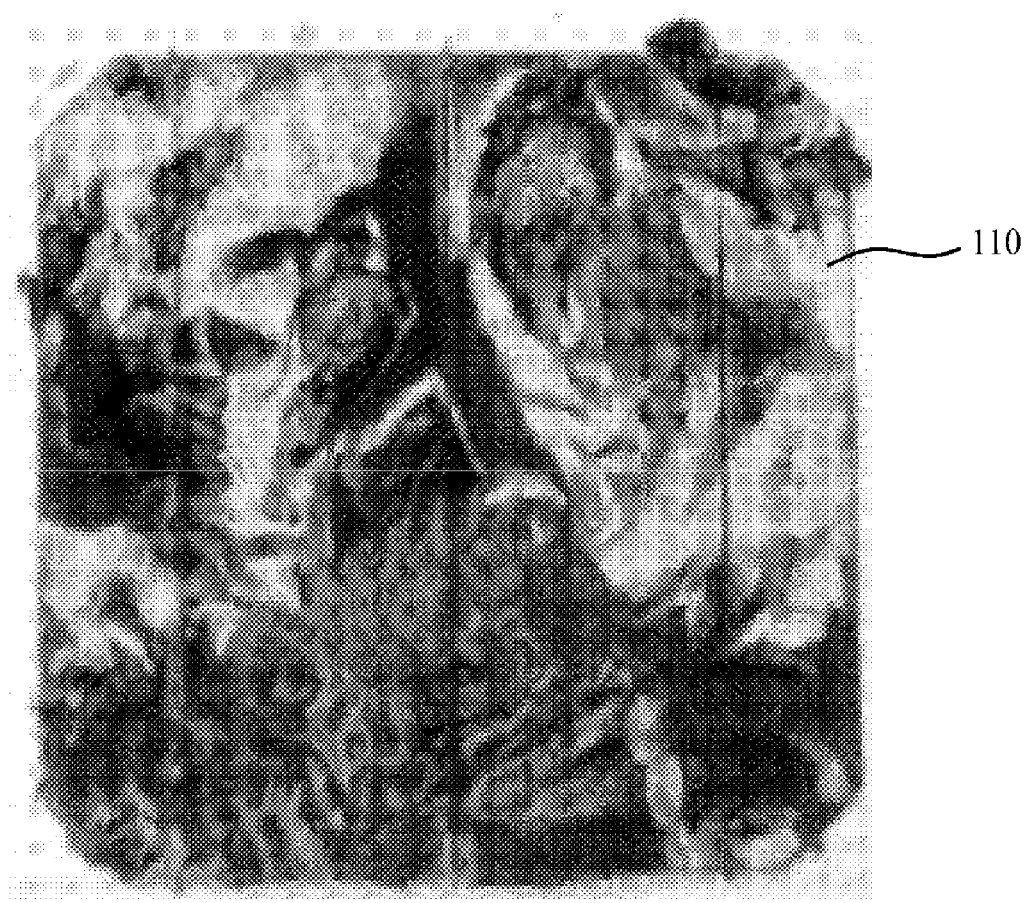
FIG. 16 illustrates a result of performing a pre-heating to glass on which a crack is formed.

FIG. 15 illustrates a cross-sectional view of a photovoltaic module in which a crack is formed on glass without forming a pattern on a second encapsulant 123, and FIG. 16 illustrates a result of performing a pre-heating to glass on which a crack is formed.

As shown in FIG. 15, at least a portion of the first encapsulant 121 may be exposed to the outside through the crack 132 of the glass 130.

When the pre-heating for the glass 130 is performed, the first encapsulant 121 in contact with a first area 450 of the glass 130 on which the crack 132 is formed may be removed faster than the first encapsulant 121 in contact with a second area 460 of the glass 130 on which the crack 132 is not formed.

That is, an external heat may be transmitted directly to the first encapsulant 121 in contact with the first area 450 through the crack 132. Therefore, the temperature of the first encapsulant 121 in contact with the first area 450 may be increased more quickly than the first encapsulant 121 in contact with the second area 460. At this time, the gas, which is generated when the first encapsulant 121 is burnt, may be emitted to the outside through the crack 132.

In the meantime, the second encapsulant 123 may be shrunk through pre-heating. The shrinkage of the second encapsulant 123 during the pre-heating may be less than the shrinkage of the second encapsulant 123 in the first comparison case. Accordingly, the photovoltaic cell 110 may not be damaged as the shrinkage of the second encapsulant 123 during the pre-heating does not serve as a stress for the photovoltaic cell 110.

During the above mentioned pre-heating, the time and temperature of the pre-heating may be adjusted to adjust the shrinkage of the second encapsulant 123.

As a result of the pre-heating to the glass 130, as shown in FIG. 16, a portion of the first encapsulant 121 and the second encapsulant 123 may be burnt and be remained on the surface of the photovoltaic cell 110, but the photovoltaic cell 110 may not be damaged.

Figure 17:
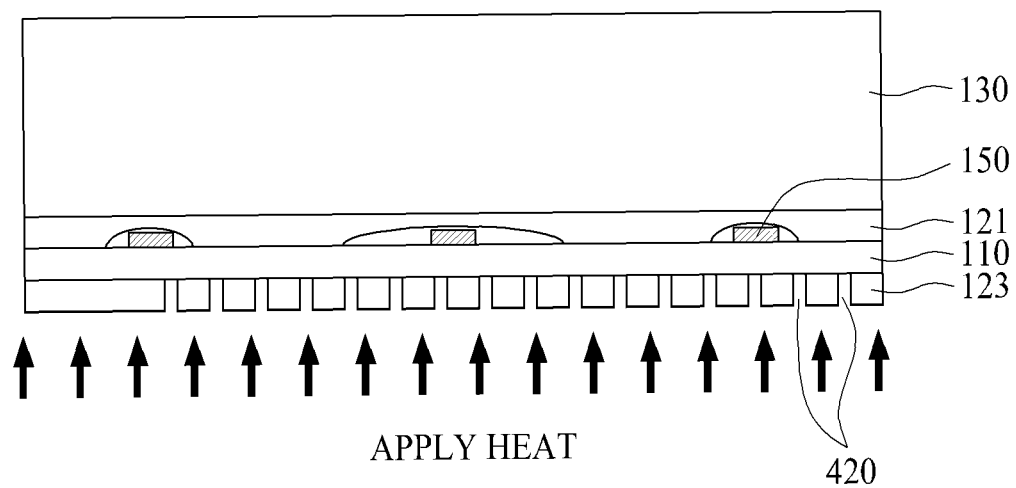
FIG. 17 illustrates a cross-sectional view of a photovoltaic module in which a pattern is formed on a second encapsulant without forming a crack on glass.

FIG. 17 illustrates a cross-sectional view of a photovoltaic module in which a pattern is formed on a second encapsulant without forming a crack on glass.

As shown in FIG. 17, at least a portion of the photovoltaic cell 110 may be exposed to the outside through the pattern 410 of the second encapsulant 123.

When the pre-heating for the second encapsulant 123 is performed, heat may be transmitted directly to the photovoltaic cell 110 through the pattern 410. In the meantime, the heat reaching the photovoltaic cell 110 may be transmitted to the first encapsulant 121 through the conductive ribbon 150.

The first encapsulant 121 may be changed into a gas while being burnt through the pre-heating. The amount of gas that the first encapsulant 121 emits through pre-heating may be less than the amount of gas that the first encapsulant 121 emits in the above described second comparison case.

Accordingly, since the pressure applied to the photovoltaic cell 110 by the gas emitted by the burning first encapsulant 121 during the pre-heating does not serve as a stress for the photovoltaic cell 110, the photovoltaic cell 110 may not be damaged.

During the above mentioned pre-heating, the time and temperature of the pre-heating may be adjusted to adjust the amount of gas of the first encapsulant 121.

Figure 18:
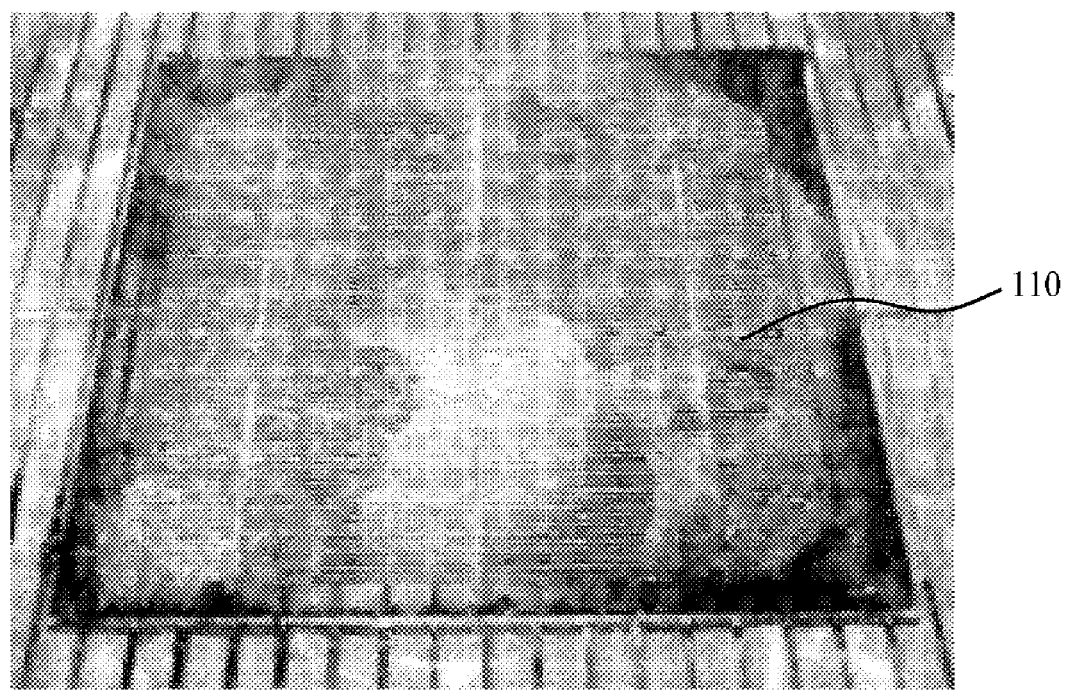
FIG. 18 illustrates a result of performing a pre-heating to a second encapsulant on which a pattern is formed.
Figure 19:
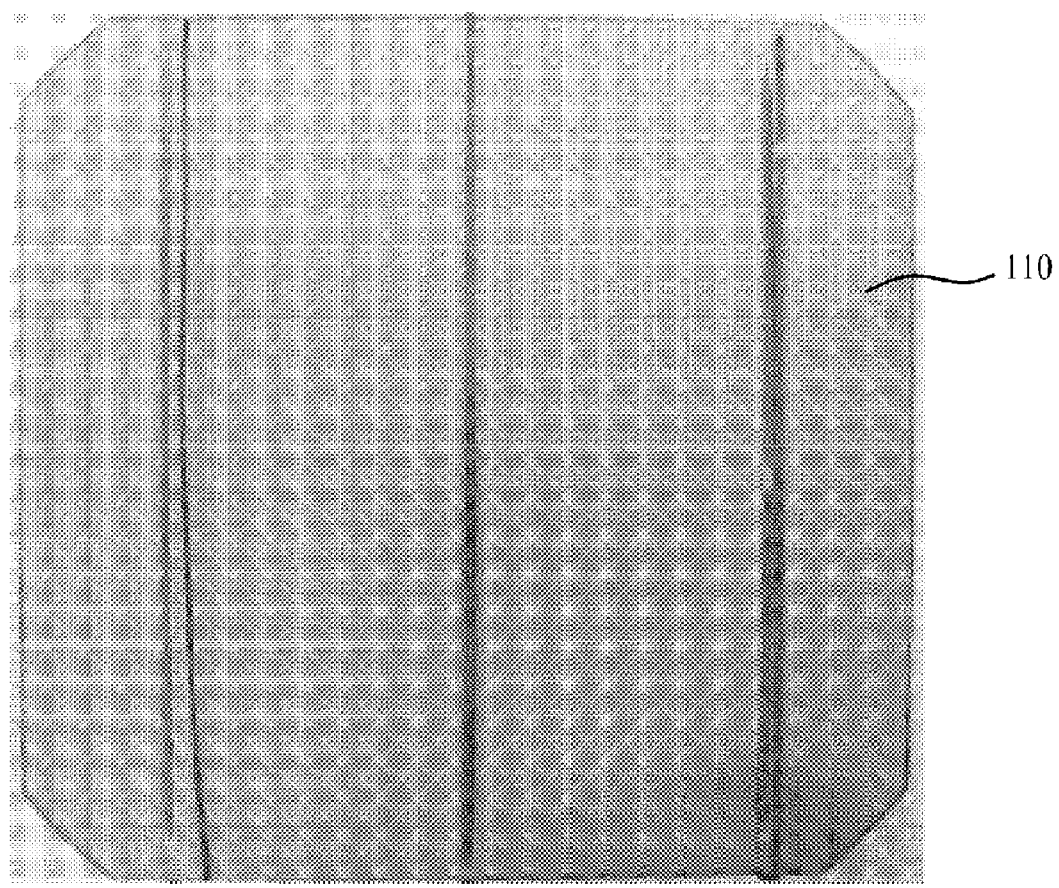
FIG. 19 illustrates a photovoltaic cell recovered through a method of disassembling a photovoltaic module according to a third embodiment of the present invention.

As a result of the pre-heating to the second encapsulant 123, as shown in FIG. 18, a portion of the first encapsulant 121 and the second encapsulant 123 may be burnt and be remained on the surface of the photovoltaic cell 110, but the photovoltaic cell 110 may not be damaged as shown in FIG. 19.

Thus, unlike the first comparison case and the second comparison case which were described above, the method of disassembling a photovoltaic module according to the third embodiment of the present invention may perform a pre-heating, and adjust the time and temperature of the pre-heating, so that a shrinkage of the encapsulant 123 may be adjusted or an amount of gas of the first encapsulant 121 may be adjusted, thereby, preventing the photovoltaic cell 110 from being damaged.

That is, in the method of disassembling a photovoltaic module according to the third embodiment of the present invention, the temperature of the pre-heating is higher than the temperature of the heat applied to the glass 130 and the second encapsulant 123 after the pre-heating, and a time during when the pre-heating is performed may be shorter than a time during when the heat is applied.

The temperature of heat applied to the glass 130 and the second encapsulant 123 simultaneously may be, for example, in a range of 400° C. to 650° C. The temperature of the heat may be 400° C. or more, as the first encapsulant 121 and the second encapsulant 123 should be melted.

In addition, since an aluminum electrode (not shown) of the photovoltaic cell 110 should be prevented from being melted, the temperature of the heat may be 650° C. or less.

Accordingly, the temperature of the pre-heating may be 650° C. or more which is higher than the temperature of the heat. In addition, the time of the pre-heating may be shorter than the time during when the heat is applied to the glass 130 and the second encapsulant 123 simultaneously.

Since the time during when the pre-heating is performed is shorter than the time during when the heat is applied to the glass 130 and the second encapsulant 123 simultaneously although the temperature of the pre-heating is higher than the temperature of the heat, the shrinkage of the second encapsulant 123 may be smaller as compared with the case in which the heat is applied, and the amount of emitted gas of the first encapsulant 121 may be smaller as compared with the case in which the heat is applied. Thus, the photovoltaic cell 110 may be prevented from being damaged during the pre-heating.

In addition, since the time of the pre-heating is short, the aluminum electrode may be prevented from being melted.

In addition, since a portion of the first encapsulant 121 and the second encapsulant 123 is removed through the pre-heating, the amount of the remaining first encapsulant 121 and second encapsulant 123 may be less than the amount of the first encapsulant 121 and second encapsulant 123 before the pre-heating.

Thus, as the heat is applied simultaneously to the glass 130 and the second encapsulant 123 after the pre-heating, the gas generation by the first encapsulant 121 or the shrink of the second encapsulant 123 is not occurred suddenly, so that the photovoltaic cell 110 may be prevented from being damaged.

The method of disassembling a photovoltaic module according to the third embodiment of the present invention may recover the photovoltaic cell 110 while minimizing the damage of the photovoltaic cell 110 by applying the heat to the glass 130 and the second encapsulant 123 simultaneously, after performing a pre-heating to one of the glass 130 in which the crack is formed or the second encapsulant 123 in which the pattern is formed.

As described above with reference to drawings, the photovoltaic cell 110 recovered through the method of disassembling a photovoltaic module according to the second embodiment and the third embodiment of the present invention may not be damaged and be intact.

Although exemplary embodiments of the present invention have been described in detail hereinabove, it should be clearly understood that many variations and modifications of the basic inventive concepts herein taught which may appear to those skilled in the present art will still fall within the spirit and scope of the present invention, as defined in the appended claims.

What is claimed is:
1. A method of disassembling a photovoltaic module including a plurality of photovoltaic cells and a conductive ribbon connecting the photovoltaic cells to each other, the conductive ribbon having a base material and a metal coating layer that covers the base material, the method comprising:
applying heat to the photovoltaic module in a furnace;
removing an insulating protective layer wrapping the photovoltaic cell of the photovoltaic module;
providing an oxidizing atmosphere in the furnace so that metallic oxide is formed on the metal coating layer of the conductive ribbon in a process of applying heat to the photovoltaic module; and
obtaining the conductive ribbon separated from the photovoltaic cell by the metallic oxide and the photovoltaic cell of the photovoltaic module.

2. The method of claim 1, wherein a heat ranging from 400° C. to 650° C. is applied to the photovoltaic module in the oxidizing atmosphere so that the insulating protective layer is removed.

3. The method of claim 1, wherein the insulating protective layer includes at least one of ethylene vinyl acetate (EVA), polyvinylfloride (PVF), polyvinyl butyral (PVB), polyethylene, olefin-based resin, silicone-based resin, and ionomer-based resin.

4. The method of claim 1, wherein the photovoltaic module includes a glass which is located on one side of the insulating protective layer and a back sheet which is located on the other side of the insulating protective layer, and the insulating protective layer and the back sheet are removed simultaneously from the photovoltaic module by the heat.

5. The method of claim 1, wherein the photovoltaic module includes a glass which is located on one side of the insulating protective layer and a back sheet which is located on the other side of the insulating protective layer, and the insulating protective layer is removed after a pre-heating for the back sheet is performed to remove the back sheet.

6. The method of claim 1, further comprising removing a frame wrapping a periphery of the photovoltaic module before removing the protective insulating layer.

7. The method of claim 1, wherein the photovoltaic module includes a glass which is located on one side of the insulating protective layer, and the glass is obtained without being damaged.

8. The method of claim 1, wherein moisture is inpoured in a process of removing the insulating protective layer in the oxidizing atmosphere.

9. A method of disassembling a photovoltaic module that recovers a photovoltaic cell from the photovoltaic module in which a glass, a first encapsulant, the photovoltaic cell, and a second encapsulant are sequentially disposed, the method comprising:
forming a crack on the glass;
forming a pattern on the second encapsulant;
applying heat to the glass and the second encapsulant; and
recovering the photovoltaic cell.

10. The method of claim 9, further comprising:
laying the second encapsulant on a first pattern member that provides the pattern, and heating the first pattern member; and
moving the second encapsulant on which the pattern is formed to a second pattern member having a temperature lower than that of the first pattern member.

11. A method of disassembling a photovoltaic module that recovers a photovoltaic cell from the photovoltaic module in which a glass, a first encapsulant, the photovoltaic cell, and a second encapsulant are sequentially disposed, the method comprising:
forming a pattern on the second encapsulant;
applying heat to the glass and the second encapsulant; and
recovering the photovoltaic cell.

12. The method of claim 11, further comprising forming a crack on the glass.

13. The method of claim 12, further comprising performing a pre-heating to the glass on which the crack is formed and the second encapsulant on which the pattern is formed.

14. The method of claim 13, wherein a temperature of the pre-heating is higher than that of the heat, and a time to perform the pre-heating is shorter than a time to apply the heat.

15. The method of claim 11, further comprising:
laying the second encapsulant on a first pattern member that provides the pattern, and heating the first pattern member; and
moving the second encapsulant on which the pattern is formed to a second pattern member having a temperature lower than that of the first pattern member.

* * * * *